(12) United States Patent
Cathelin et al.

(10) Patent No.: US 8,594,226 B2
(45) Date of Patent: Nov. 26, 2013

(54) METHOD FOR PROCESSING A DIGITAL SIGNAL IN A DIGITAL DELTA-SIGMA MODULATOR, AND DIGITAL DELTA-SIGMA MODULATOR THEREFOR

(75) Inventors: Andreia Cathelin, Laval (FR); Antoine Frappe, Lille (FR); Andreas Kaiser, Villeneuve d'Ascq (FR)

(73) Assignees: STMicroelectronics SA, Montrouge (FR); Centre National de la Recherche Scientifique, Paris (FR)

( * ) Notice: Subject to any disclaimer, the term of this patent is extended or adjusted under 35 U.S.C. 154(b) by 970 days.

(21) Appl. No.: 12/522,011

(22) PCT Filed: Jan. 10, 2008

(86) PCT No.: PCT/FR2008/050051
§ 371 (c)(1),
(2), (4) Date: Feb. 1, 2010

(87) PCT Pub. No.: WO2008/102091
PCT Pub. Date: Aug. 28, 2008

(65) Prior Publication Data
US 2010/0142641 A1    Jun. 10, 2010

(30) Foreign Application Priority Data

Jan. 16, 2007 (FR) .................................... 07 52701

(51) Int. Cl.
*H04L 27/04* (2006.01)
*H04L 27/20* (2006.01)

(52) U.S. Cl.
USPC ............ 375/295; 375/296; 375/243; 375/245

(58) Field of Classification Search
USPC .............. 375/295, 296, 243, 245; 341/143
See application file for complete search history.

(56) References Cited

U.S. PATENT DOCUMENTS

| | | | | |
|---|---|---|---|---|
| 5,867,537 | A * | 2/1999 | Dent ............................. | 375/298 |
| 7,903,010 | B1 * | 3/2011 | Melanson ..................... | 341/143 |
| 2002/0190884 | A1 * | 12/2002 | Yu ................................ | 341/144 |
| 2011/0050472 | A1 * | 3/2011 | Melanson ..................... | 341/143 |

OTHER PUBLICATIONS

Hossack, et al: Circuits and Systems; ISCAS '94., 1994 IEEE International Symposium on; Publication Year: 1994, pp. 481-484, vol. 2.*
Abeysekera et al: *Design of Multiplier Free FIR Filters Using a LADF Sigma-Delta (/spl Sigma/-/spl Delta) Modulator*; Circuits and Systems, 2000 Proceedings. ISCAS 2000 Geneva. The 2000 IEEE International Symposium on May 28-31, 2000 NJ, May 28, 2000, vol. 2; pp. 65-68.
Hossack et al: *The Application of Redundant Number Systems to Digital Sigma-Delta Modulators*; Circuits and Systems, 1994, ISCAS 1994 IEEE International Symposium on London, UD, May 30, 1994-Jun. 2, 1994, vol. 2; pp. 481-484.

(Continued)

*Primary Examiner* — Qutbuddin Ghulamali
(74) *Attorney, Agent, or Firm* — Allen, Dyer, Doppelt, Milbrath & Gilchrist, P.A.

(57) ABSTRACT

The digital delta-sigma modulator includes a signal input for receiving digital samples of N bits, and a digital filter connected to the signal input. The digital filter performs addition/subtraction and integration operations according to a redundant arithmetic coding for delivering digital filtered samples. A quantizer performs a nonexact quantization operation so as to deliver digital output samples of n bits, with n being less than N. The input of the quantizer is connected within the digital filter.

18 Claims, 12 Drawing Sheets

(56) References Cited

OTHER PUBLICATIONS

Yonghong Gao et al: *A 71 Msample/sec Fifth Order Sigma-Delta Digital Modulator*, Circuits and Systems, 2000 42$^{nd}$ Midwest Symposium on Aug. 8-11, 1999, NJ vol. 1 Aug. 8, 1999, pp. 456-459.

Stonick et al: *Look-Ahead Decision-Feedback/Spl Sigma Spl Delta/ Modulation*; Acoustics, Speech, and Signal Processing, 1994. ICASSP-94, NY vol. Iii, Apr. 19, 1994 pp. III-541.

* cited by examiner

METHOD FOR PROCESSING A DIGITAL SIGNAL IN A DIGITAL DELTA-SIGMA MODULATOR, AND DIGITAL DELTA-SIGMA MODULATOR THEREFOR

FIELD OF THE INVENTION

The invention relates to digital delta-sigma modulators and applies advantageously, but not limitingly, to the transmission of radio frequency signals. More particularly, the invention applies wireless transmission devices such as cellular mobile telephones, for example, whose transmission chain incorporates a digital delta-sigma modulator.

BACKGROUND OF THE INVENTION

A digital delta-sigma modulator encodes a digital signal on a small number of levels, and at a sampling frequency that is much greater than the bandwidth of the signal to be encoded. The particular feature of such an encoder is its transfer function with respect to the quantization noise, which pushes the latter back out of the bandwidth of the signal. Thus, by a suitable filtering, the signal-to-noise ratio in the bandwidth is greatly improved with respect to conventional over-samplers.

A conventional delta-sigma digital modulator comprises an input for receiving digital data sampled on N bits, and an output which delivers a digital sampled value (quantized) on n bits, with n being less than N (e.g., equal to). A loop filter is connected to the input and allows filtering and shaping of the quantization noise. A quantizer on n bits is connected to the output, and looped back to the loop filter.

Conventionally, a digital loop filter of a delta-sigma modulator is generally made up of adders and registers (flip-flops) which are regulated by a clock signal. The number of registers fixes the order of the modulator, and hence the precision of the encoding of the signal. Between two registers, in the course of a period of the clock signal, a calculation on digital values is performed which is principally additions.

In a circuit which uses coding of two's complement numbers, the carry propagation time is dependent on the number of bits of the signal. This rapidly becomes incompatible with a high clock frequency.

One approach includes using a redundant arithmetic for coding the data. That is, a coding in which the same value may be coded in various ways. Several redundant arithmetic codings exist. For example, reference may be made to the coding of the negative carry conservation type, better known to the person skilled in the art by the name borrow-save (BS), in which each bit of the signal is represented by a coding on three values which are −1, 0 and 1. Consequently 2N bits are required for a signal which is coded on N bits in 2's complement.

The advantage of using a redundant arithmetic such as this lies in the fact that there is no longer any carry propagation during addition. The addition may therefore be done in a constant time independently of the number of bits. However, the calculation of the quantization still requires a carry propagation. This still proves to be incompatible with a high frequency clock signal.

One approach then includes using a nonexact quantization of the output. More precisely, whereas in an exact quantization, the quantization uses all the bits of the signal that is present at the input of the quantization to determine the quantized output signal. In a nonexact quantization, only part of the bits of the signal that is present at the input of the quantization is used to perform the quantization. Such an approach is described, for example, in the article by Hossack and Sewell titled "The Application of Redundant Number Systems to Digital Sigma-Delta Modulators", pages 481 to 484, ISCAS, 1994.

However, whereas such an approach using a redundant arithmetic and a nonexact quantization of the output reduces the carry propagation time in the quantization calculation, this reduced calculation time admittedly makes it possible to operate at higher frequencies, but still proves to be incompatible for very high clock signal frequencies, such as those used in radio frequency applications, for example.

SUMMARY OF THE INVENTION

In view of the foregoing background, an object of the present invention is to overcome the above noted problems.

This and other objects, advantages and features in accordance with the present invention are provided by a method of processing a digital input signal sampled on N bits within a digital delta-sigma modulator. This processing may comprises a formulation according to a redundant arithmetic coding of a filtered sampled signal, and a formulation of an output signal sampled on n bits, with n being less than N, using a nonexact quantization.

According to a general characteristic, the formulation of the output signal may be anticipated. Stated otherwise, in contradiction to the prior art in which the output signal quantized on n bits was formulated after having formulated the filtered sampled signal, the formulation of the output signal may be anticipated in the method. That is, the output signal may be formulated on the basis of intermediate signals tapped off within a chain of processing for formulating the filtered sampled signal. This may make it possible, in particular, to deliver simultaneously the filtered sampled signal which will be looped back to a last addition/subtraction module of the modulator. The quantized output signal may also be looped back to all the addition/subtraction modules of the modulator.

Thus, according to one mode of implementation, the formulation of the filtered sampled signal may comprise a succession of elementary processings on the basis of the input signal, samples of the filtered signal and of the output signal. The anticipation of the formulation of the output signal may comprise the formulation of the output signal in parallel with at least one of the elementary processings for formulating the filtered sampled signal.

Stated otherwise, the parallelization of the calculations may be provided which allows compatibility of the operation of the modulator with very high working frequencies. The formulation of the output signal may be performed in parallel with the last elementary processing for formulating the filtered sampled signal.

The anticipation of the formulation of the output signal may comprise the formulation of the output signal on the basis of certain bits only of the samples of intermediate sampled signals tapped off before the last elementary processing for formulating the filtered sampled signal.

The number n representing nonexact quantization logic functions may be defined. Each may involve a specific part only of the bits of each sample of the filtered signal, and each may provide a bit of each sample of the output signal. The formulation of the output signal may comprise the formulation of n anticipation logic functions. Each anticipation logic function may provide a bit of each sample of the output signal, and may be obtained on the basis of the corresponding nonexact quantization logic function. This may also involve particular bits of the samples of the intermediate signals which make it possible to obtain the specific bits in view of the elementary processing or processings for formulating the filtered sampled signal to be performed on these samples of intermediate signals.

Although the method may be applied to any redundant arithmetic coding, it will advantageously be possible to use a coding of the negative carry conservation type (borrow-save).

According to another aspect, a digital delta-sigma modulator comprising a signal input for receiving digital samples of N bits, and digital filtering means or a digital filter are connected to the signal input to perform addition/subtraction and integration operations according to a redundant arithmetic coding so as to deliver digital filtered samples. Quantization means or a quantizer may perform a nonexact quantization operation so as to deliver digital output samples of n bits, n being less than N. The input of the quantizer may be connected within the digital filter.

The digital filter may comprise a chain of at least one adder/subtracter module. Each module may be looped back on itself, and may comprise several addition/subtraction stages connected in cascade. The input of the quantizer may be connected upstream of the last addition/subtraction stage of the last adder/subtracter module. The output of the quantizer may also be looped back to each module. For example, the input of the quantizer may be connected to the interior of the last module upstream of the last addition/subtraction stage of this last adder/subtracter module.

The number n representing nonexact quantization logic functions may be defined, each involving a specific part only of the bits of each sample of the filtered signal and each providing a bit of each sample of the signal. The quantizer may comprise n logic cells respectively implementing n anticipation logic functions, and respectively deliver the n bits of each sample of the output signal. Each anticipation logic function may be obtained on the basis of the corresponding nonexact quantization logic function. The corresponding logic cell may receive as input particular bits of the samples of the intermediate signals which make it possible to obtain the specific bits having regard to the addition/subtraction stage or stages situated downstream of the input of said cell.

According to yet another aspect, an element of a wireless communication system, such as a cellular mobile telephone comprising a transmission chain incorporating a delta-sigma modulator as defined above is provided, for example.

BRIEF DESCRIPTION OF THE DRAWINGS

Other advantages and characteristics of the invention will become apparent on examining the detailed description of nonlimiting embodiments and modes of implementation and the appended drawings in which.

DETAILED DESCRIPTION OF THE PREFERRED EMBODIMENTS

Figure 1:
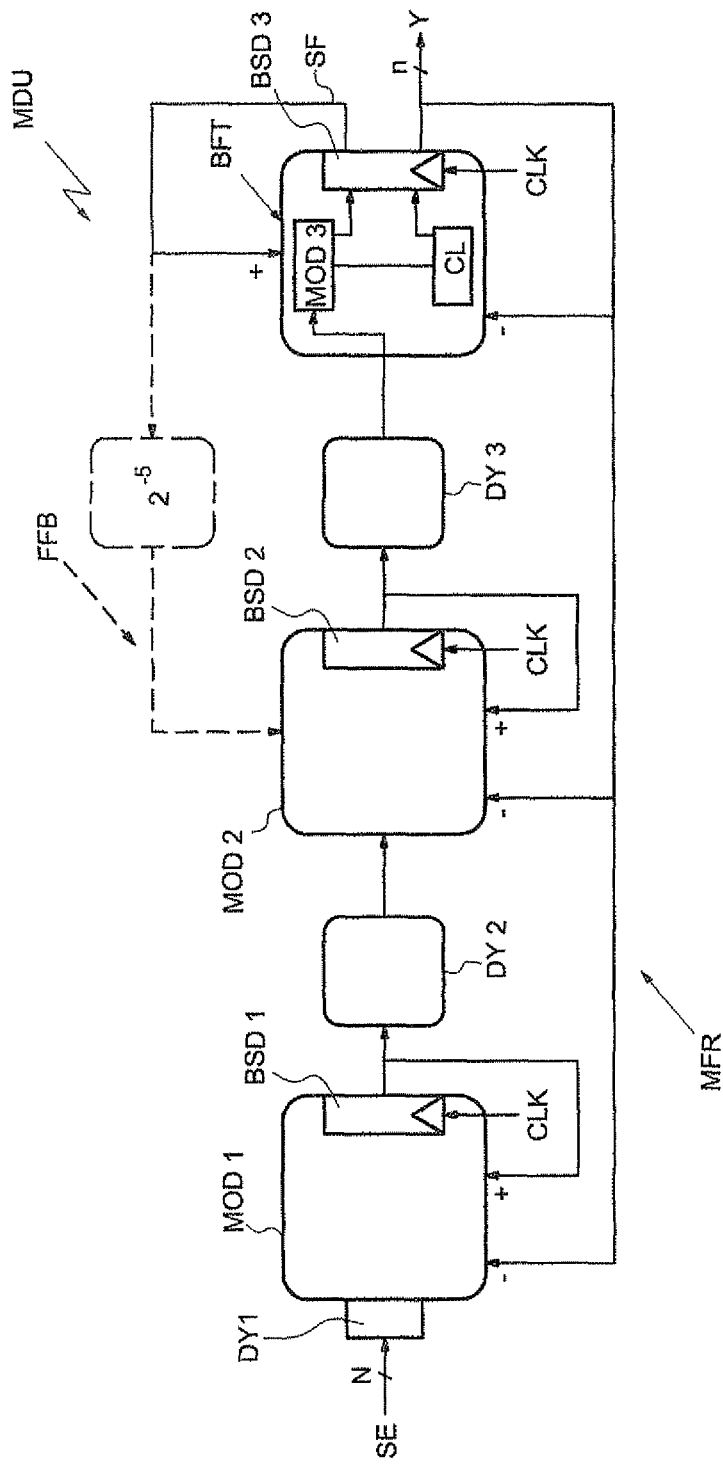
FIG. 1 is a schematic diagram of a delta-sigma modulator according to the invention.

In FIG. 1, the reference MDU designates a delta-sigma modulator. This delta-sigma modulator essentially comprises looped filtering means or a looped filter MFR as well as quantization means or a quantizer CL.

Since the modulator MDU is of order 3, the filter MFR comprises three adder/subtracter modules MOD1, MOD2 and MOD3. The output of each of these modules is looped back to one of its inputs so as to perform an integration function. Moreover, the output data of each module are delivered by way of a flip-flop BSDi regulated by a clock signal CLK having a frequency Fs.

The modulator MDU receives as input a digital input signal SE sampled on N bits. Stated otherwise, the modulator MDU receives successive samples of N bits. The modulator MDU, and more particularly the quantizer CL, delivers by way of the flip-flop BSD3 of the final processing block BTF an output signal Y sampled on n bits, with n being less than N. In the nonlimiting example described here, n is equal to 1.

As well as the quantizer CL just described, the filter MFR of the modulator MDU also comprises element DYi to reduce the dynamic range of the input signal SE and of the intermediate signals in such a way as to avoid saturation of the various elements of the modulator.

Moreover, the quantized output signal Y is looped back to each of the adder/subtracter modules MODi of the modulator MDU, possibly after multiplication by an appropriate gain which may be different for each of the feedback loops.

Delta modulation is based on quantizing the modification of the signal from sample to sample, rather than on quantizing the absolute value of the signal at each sample. The presence of an integrator (sigma) in the modulator gives the modulator the name delta-sigma modulator.

The output of the delta-sigma modulator is at a very high oversampling frequency (frequency of the clock signal) Fs. This is a fundamental characteristic of delta-sigma modulators because they use the high-frequency portion of the spectrum to push back the major part of the quantization noise. Specifically, a delta-sigma modulator is designed to push the quantization noise back out of the band of the useful signal.

Although it is not indispensable, the modulator MDU may also comprise an additional filter FFB intended to further reduce the noise in the band of the signal. This filter FFB may be formed by a looping back of the filtered signal SF to the second module MOD2 by way of a gain (division by $2^5$).

The number of bits of the samples of the intermediate signals delivered by the various modules, the number of bits of the samples of the filtered signal, the values for the reduction in the dynamic ranges of the signals (means DY1, DY2 and DY3), as well as the various feedback gains of the signal Y, are chosen so as to avoid saturation of the various elements of the modulator MDU. This is in view of the application envisaged, as well as of the desired oversampling ratio and of the desired signal-to-noise ratio. A person skilled in the art will be able to adapt these various parameters depending on the application desired. Nonetheless, the invention applies regardless of the value of these various parameters.

The input signal SE is a digital signal coded according to a 2's complement notation. The same goes for the quantized output signal Y. The intermediate sampled signals as well as the filter signal SF are coded according to a redundant arithmetic which is an arithmetic of the negative carry conservation type (borrow-save: BS).

Specifically, the benefit of redundant-arithmetic coding systems is to make it possible to perform additions/subtractions in a totally parallel manner, that is, with no carry propagation.

It is recalled here that a relative integer is represented in 2's complement (denoted C2 in the rest of the text) as follows:

$$A = a_{n-1}a_{n-2} \ldots a_1 a_0 = -a_{n-1}2^{n-1} + \sum_{i=0}^{n-2} a_i 2^i$$

Figure 2:
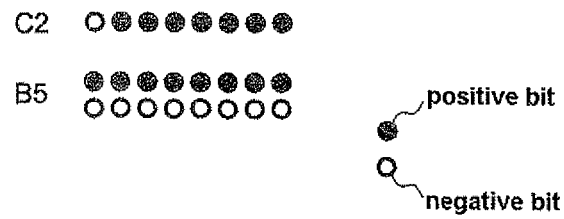
FIGS. 2 to 7 illustrate a type of 2's complement coding, a redundant coding of the borrow-save type as well as the mechanisms for adding numbers coded according to the two codings with examples of corresponding hardware cells according to the invention.

Represented by way of example in FIG. 2 is a number coded in 2's complement on 8 bits, with 7 positive bits (represented by a black dot) and a negative bit (represented by a white dot). In this regard, this black dot and white dot notation for denoting a positive bit and a negative bit, respectively, will be adopted throughout the rest of the figures.

It is also possible to represent the numbers to the base $\beta$ by the set of digits $\{-\alpha, -\alpha+1, \ldots, 0, \ldots \alpha-1, \alpha\}$ instead of the digits of $\{0, 1, 2, \ldots, \beta-1\}$ with $\alpha \leq \beta-1$. In this system, if $2\alpha+1 > \beta$, the numbers may be written in several possible ways. The system is then said to be redundant.

Among the redundant arithmetic codings, mention may be made as indicated above of the borrow-save (BS) coding. In this coding, the number A is represented to the base 2 with the digits $a_i \in \{-1, 0, 1\}$ on two wires such as $a_i = a_i^+ - a_i^-$ where $a_i^+ \in \{0, 1\}$ and $a_i^- \in \{0, 1\}$.

$$A = \sum_{i=0}^{n-1} a_i 2^i = \sum_{i=0}^{n-1} (a_i^+ - a_i^-) 2^i$$

A number coded with BS coding will therefore be represented by a series of positive bits and a series of negative bits. By way of example, also represented in FIG. 2 is an example of BS coding of a number using 8 positive bits and 8 negative bits.

The processing performed within the modulator involves, in particular, additions/subtractions of two numbers respectively coded by BS coding and C2 coding, and additions/subtractions of two numbers coded by BS coding.

Figure 3:
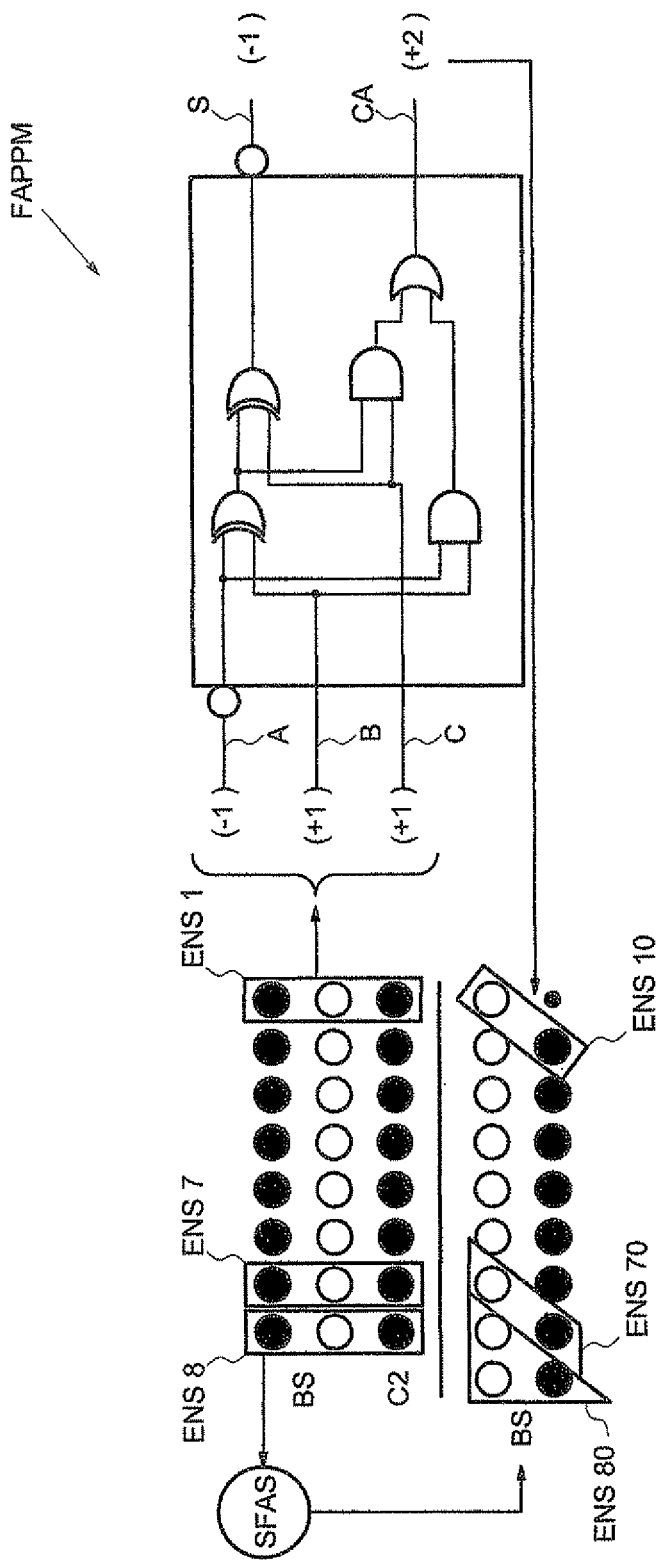

FIGS. 3 to 7 illustrate examples of implementing such operations, as well as the associated addition/subtraction cells. More precisely, represented in FIG. 3 is the addition of a number coded by BS coding with a number coded by C2 coding to obtain a result coded by BS coding.

In the example described, the two numbers are coded on 8 bits. The addition is performed bitwise using for each set ENSi of 3 bits with i varying from 1 to 7, an addition cell FAPPM such as that represented in the right-hand part of FIG. 3.

More precisely, in the example described here, the cell FAPPM is an addition cell "++−" that receives as input the negative bit A and the two positive bits B and C, and delivers as output a negative sum S of the same weight as the input bits as well as a positive carry CA of immediately higher weight. Thus, the addition of the three bits ENS1 leads to the set of two bits ENS10.

Figure 4:
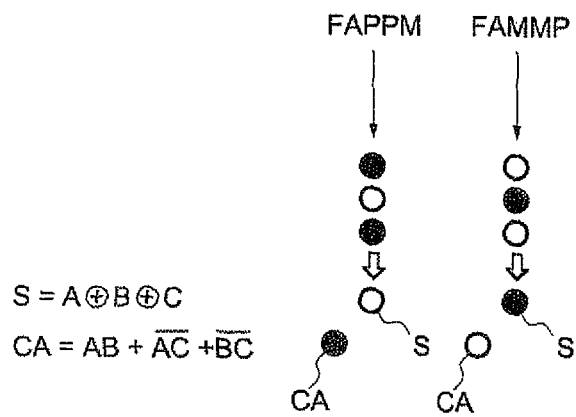

FIG. 4 illustrates on the left-hand part the logic equations making it possible to obtain the outputs S and CA on the basis of the inputs A, B and C. The right-hand part of FIG. 4 reuses the principle of obtaining the bits S and CA on the basis of the three input bits, in the case of a cell FAPPM (of the ++− type). This being said, it is also possible to use a cell similar to the FAPPM cell, but of the −−+ type (referenced FAMMP) and also providing sum and carry bits on the basis this time of two negative bits and one positive bit. In this case, the sum S is positive whereas the carry CA is negative and of higher weight.

Figure 5:
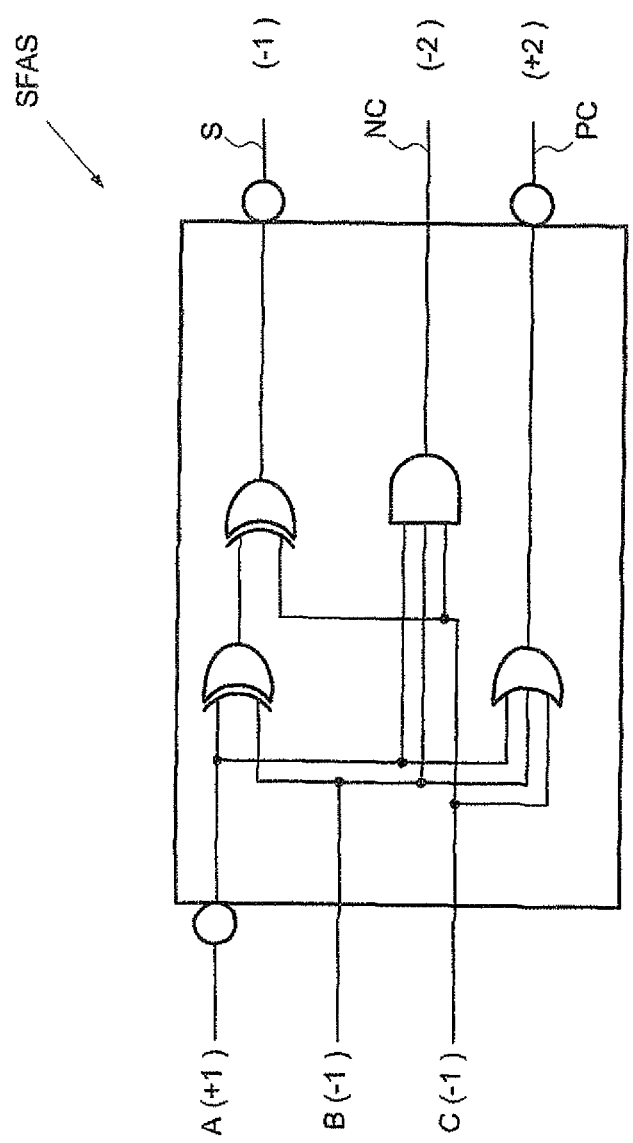

The addition of the high-order bits ENS8 (FIG. 3) requires the use of a more specific cell such as that illustrated in FIG. 5 and referenced SFAS. This cell SFAS, whose logic equations are represented on the left-hand part of FIG. 6, receives as input the positive bit and two negative bits and provides as output a negative sum S, of the same weight as the input bits, as well as a negative carry NC of higher weight, and a positive carry PC of likewise higher weight.

Thus, the set of bits ENS8 will give, after addition, the three bits ENS80 (FIG. 3). Here again, the right-hand part of FIG. 6 reuses the principle of obtaining these three result bits. Thus, the addition/subtraction of the two numbers respectively coded by BS and C2 codings of FIG. 3 therefore requires the use in parallel of 7 cells FAPPM and of one cell SFAS.

Figure 7:
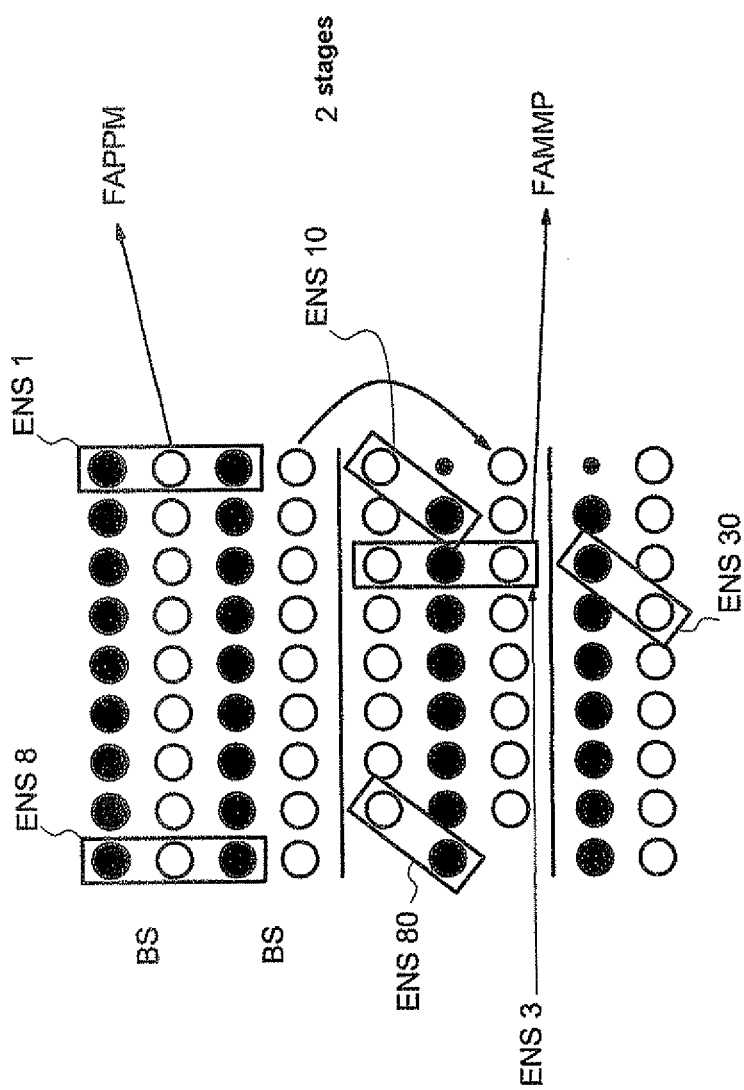

FIG. 7 illustrates the addition/subtraction of two numbers each coded by BS coding. Such an addition/subtraction requires two cascade-connected stages of addition/subtraction cells.

More precisely, each set of three bits ENSi, i=1 to 8, is added together within a cell FAPPM to give the sets of two bits ENS10-ENS80. The negative bits of the second number coded by BS are transferred as is into the second stage. In this second stage, the sets of three bits, such as the set ENS3, are each added together in a cell FAMMP to give a set of two bits, such as the set ENS30.

Figure 8:
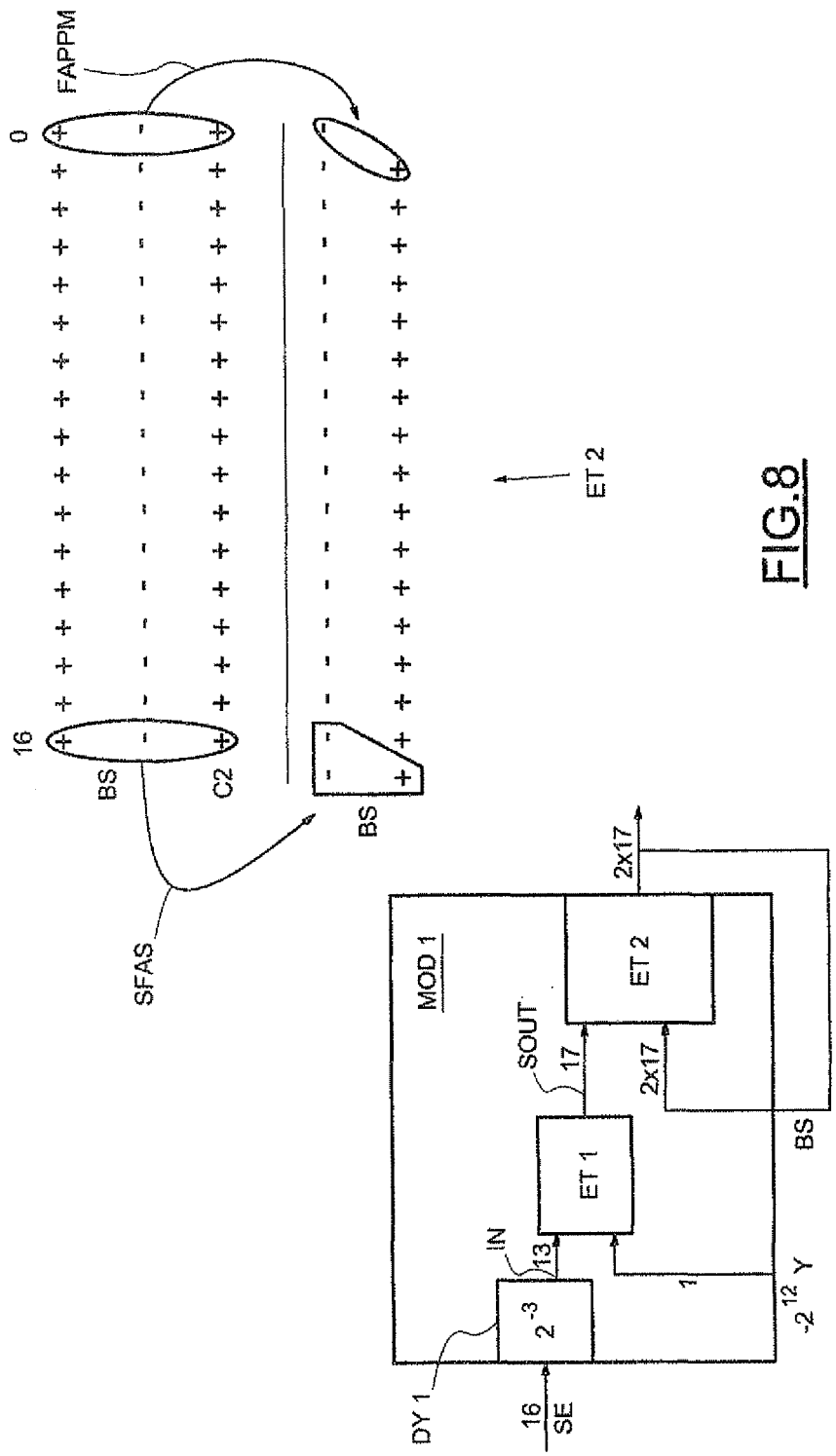
FIGS. 8 and 9 illustrate in greater detail the internal architecture of the first module of the modulator of FIG. 1.
Figure 9:
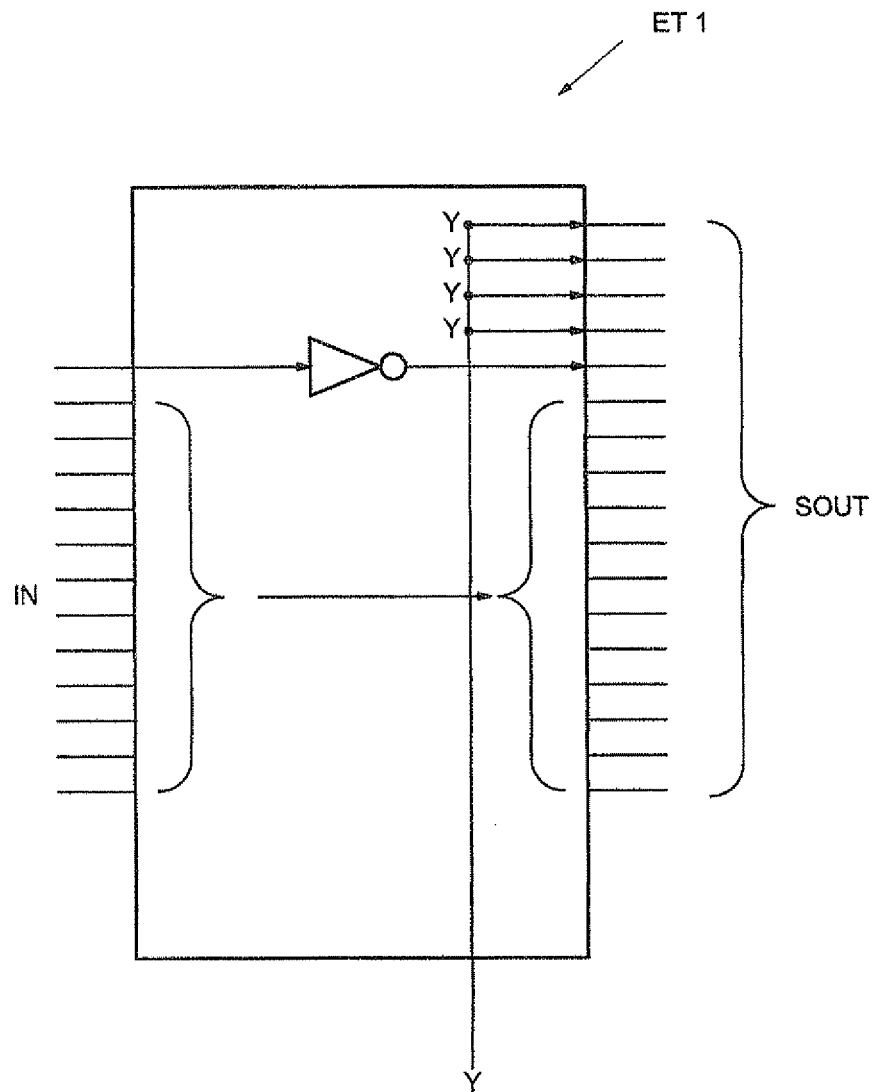
Figure 10:
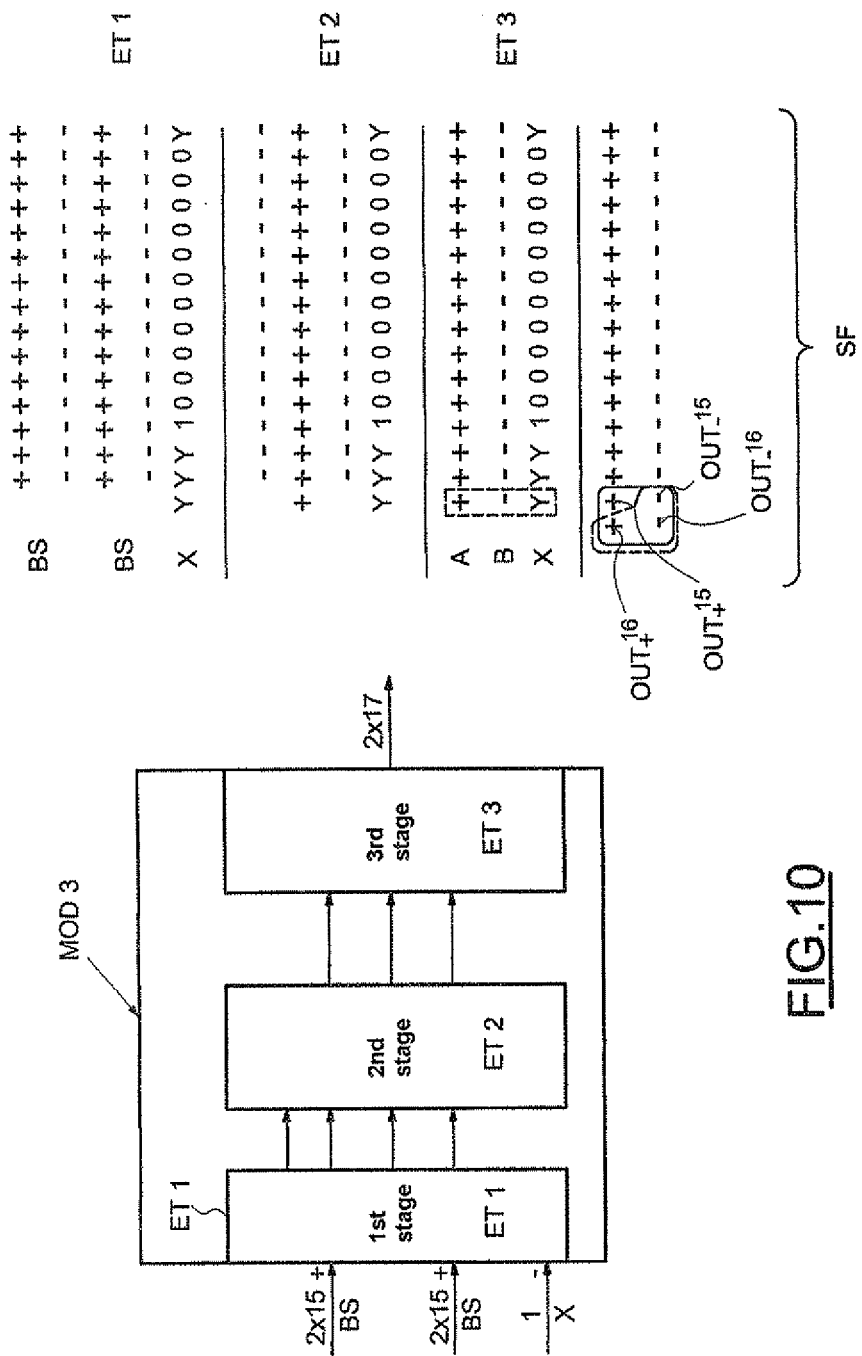
FIG. 10 illustrates in greater detail the internal architecture of the last addition/subtraction module of the modulator of FIG. 1.

Reference is now made more particularly to FIGS. 8 to 10 to describe in greater detail the internal architecture of the modules MOD1 and MOD3. In FIG. 8, it is assumed by way of example that each sample of the input signal SE has 16 bits and is reduced to 13 bits in the means DY1.

The stage ET1 of the module MOD1 must therefore subtract from each sample of 13 bits of the signal IN the bit Y assigned a gain of $2^{12}$, to provide an intermediate output signal SOUT sampled on 17 bits. Although it would be possible to use a conventional 2's complement adder, a more advantageous approach from the viewpoint of the propagation time for the architecture of the stage ET1 is illustrated in FIG. 9.

More precisely, it is observed that if Y is equal to 1, the result of the subtraction will always be negative whereas if Y is equal to 0, the result will always be positive. Consequently, to obtain the 17 bits of each sample of the signal SOUT, the first 12 bits of each sample of the signal IN are conserved as is the high-order bit of the sample of the signal IN is inverted, and the remaining bits of the sample of the signal SOUT are complemented with the bit Y. When Y is equal to 1, it is necessary to add 1 to the low-order bit LSB whereas nothing is added when Y is equal to 0. One approach includes, for example, in linking this LSB bit to the free carry of the next adder.

The stage ET2 of the module MOD1 will perform the addition of the samples of 17 bits in 2's complement of the signal SOUT with the samples, coded by BS coding, arising from the output of the stage ET2. Consequently, as explained above, and illustrated in the right-hand part of FIG. 8, the stage ET2 comprises 16 logic cells in parallel FAPPM and one logic cell SFAS. Together, these cells provide the intermediate output signal coded by BS coding and sampled on 2×17 bits.

Reference is now made more particularly to FIG. 10 to describe an exemplary internal architecture of the module MOD3. This module MOD3 receives a first sample of intermediate signal coded by BS coding, and originating from the output of the flip-flop BSD2 of the module MOD2 after passing through the dynamic range reduction means or element DY3 which here eliminates two bits. This sample therefore comprises 2×15 bits.

The module MOD3 also receives a second BS-coded signal, each sample of which comprises 2×15 bits. This signal originates from the output signal, sampled on 2×17 bits, and shifted by two bits. In fact, the two low-order bits of the output signal are removed by hard-wiring.

Finally, the first stage ET1 of the module MOD3 receives as third input signal a signal X which is in fact the signal originating from the quantization output Y here assigned a gain of $2^g$ (here $2^{12}$).

As illustrated in the right-hand part of FIG. 10, the first stage ET1 and the second stage ET2 sum the two signals coded by BS coding on the basis of cells FAPPM and FAMMP as explained above with reference to FIG. 7.

The third stage ET3 sums (subtracts) the signal coded by BS coding arising from the second stage and the signal X coded by 2's complement. In this regard, if X is coded on R bits (R=16 here) it is observed that when Y=0, it is necessary to deduct $-2^g$, that is to say $$\text{``}\underbrace{1 \ldots 1}_{R-g}0 \ldots 0\text{''},$$

to add $$\text{``}\underbrace{0 \ldots 0}_{R-g-1}10 \ldots 0\text{''}.$$

Likewise, when Y=1, it is necessary to deduct $2^g$, that is to say $$\text{``}\underbrace{1 \ldots 0}_{R-g}1 \ldots 1\text{''},$$

to add $$\text{``}\underbrace{1 \ldots 1}_{R-g-1}0 \ldots 01\text{''}.$$

Thus, in either case, the subtraction of X amounts to adding $$\text{``}\underbrace{X \ldots X}_{R-g-1}10 \ldots 0\overline{X}\text{''}.$$

In the present case R−g−1 is equal to 3, this gives as signal X the signal represented in the right-hand part of FIG. 10. The third stage consequently provides the signal SF, each sample of which is formed of 2×17 bits.

In the absence of a filter FFB, the module MOD2 has a similar structure to that of the module MOD3. With the filter, an additional input is simply added and the internal structure of the module MOD2 is modified accordingly by adding cells FAPPM and/or FAMMP.

Figure 11:
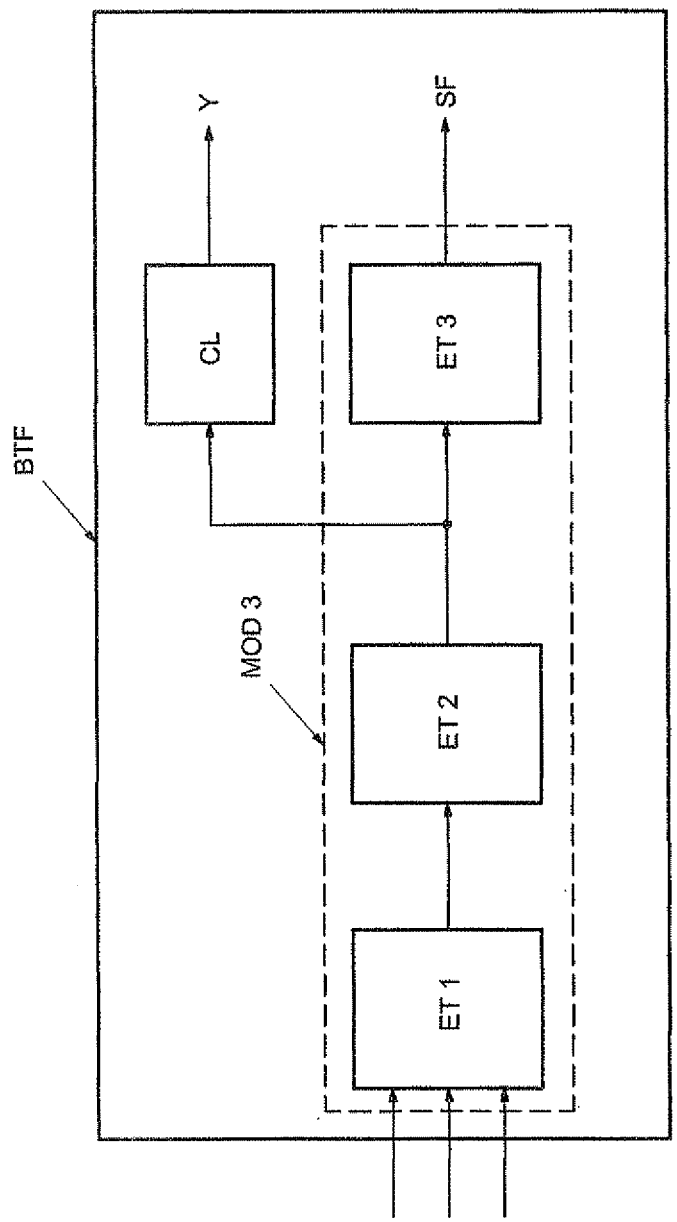
FIGS. 11 and 12 illustrate various possible connections of the quantizer within the modulator of FIG. 1.

The structure and the manner of operation of the quantizer CL will now be described in greater detail while referring more particularly to FIG. 11. Whereas in the prior art, the quantization was performed on the signal SF itself, the quantizer according to this aspect of the invention is connected to an intermediate node of the module MOD3, More particularly, it is between the stage ET2 and the stage ET3 of this module MOD3.

Here the quantization is a nonexact quantization which uses only part of the bits of each sample of the signal SF. By way of indication, as illustrated in FIG. 10, when only the two high-order bits are used, the bit Y is obtained via the following logic function:

$$Y = \text{Out}_+^{16}\overline{\text{Out}\_^{16}} + \text{Out}_+^{15}\overline{\text{Out}\_^{15}}(\text{Out}_+^{16} + \overline{\text{Out}\_^{16}})$$

Now, there are several possibilities for defining the function for calculating the sign since some states are uncertain, hence positive or negative, by choice. It is therefore possible to define on the basis of the above logic function, two other possible logic functions defined respectively by the formulae I and II below.

$$Y = \text{Out}_+^{16}\overline{\text{Out}\_^{16}} + \overline{\text{Out}\_^{15}}(\text{Out}_+^{16} + \overline{\text{Out}\_^{16}}) \quad \text{(I)}$$

$$Y = \text{Out}_+^{16}\overline{\text{Out}\_^{16}} + \overline{\text{Out}_+^{15}}(\text{Out}_+^{16} + \overline{\text{Out}\_^{16}}) \quad \text{(II)}$$

The nonexact quantization logic function represented by formula (I) is particularly beneficial since it involves only the bits $\text{OUT}_+^{16}$, $\text{OUT}\_^{16}$ and $\text{OUT}\_^{15}$ of the signal sample SF. Now, these bits are obtained on the basis of the high-order bits of the signals A, B and X using a single, same cell of the type SFAS.

Figure 6:
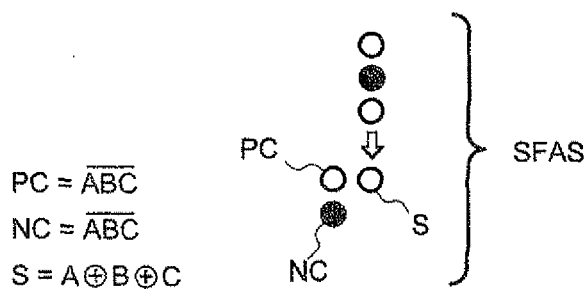

Accordingly, if the logic equations for the cell SFAS such as were mentioned in the left-hand part of FIG. 6 are used, the nonexact quantization logic function defined above by formula (I) is transformed into a logic function that will here be called the anticipation logic function defined by formula (III) below:

$$Y = A_{15}\overline{B_{15}} + A_{15}\overline{X} + \overline{B_{15}}X \quad \text{(III)}$$

This anticipation logic function consequently involves the bits $A_{15}$, $B_{15}$ and X (i.e., Y) of the intermediate signals A, B and X delivered by the second stage. These bits are surrounded by dashes in the right-hand part of FIG. 10. This anticipation logic function therefore amounts to a sum of binomials, and the logic cell CL is readily achievable on the basis of logic gates for implementing such an anticipation logic function (III).

Thus, it is noted that the logic cell CL anticipates the formulation of the output signal Y in the sense that it uses bits of intermediate signals situated upstream of the output filtering signal SF. Of course, it would also be possible to use a nonexact quantization by using only the three high-order bits of each sample of the filtered signal. A nonexact quantization logic function such as this could then be the function defined by formula (IV) below, for example.

$$Y = \text{Out}\_^{16}\overline{\text{Out}\_^{16}} + (\text{Out}_+^{15} + \overline{\text{Out}\_^{14}})\overline{\text{Out}\_^{15}}(\text{Out}_+^{16} + \overline{\text{Out}\_^{16}}) \quad \text{(IV)}$$

Since this nonexact quantization logic function involves the bit $\text{Out}\_^{14}$, account will be taken not only of the logic equations of a cell SFAS such as defined in FIG. 6, but also of the logic equations of a cell FAPPM such as defined in FIG. 4. In view of these logic equations, it is then possible to formulate the anticipation logic function defined by formula (V) below which is a sum of trinomials.

$$Y = A_{15}\overline{B_{15}} + (A_{14} + \overline{B_{14}})(A_{15}\overline{XB}_{15}X \quad (V)$$

Figure 12:
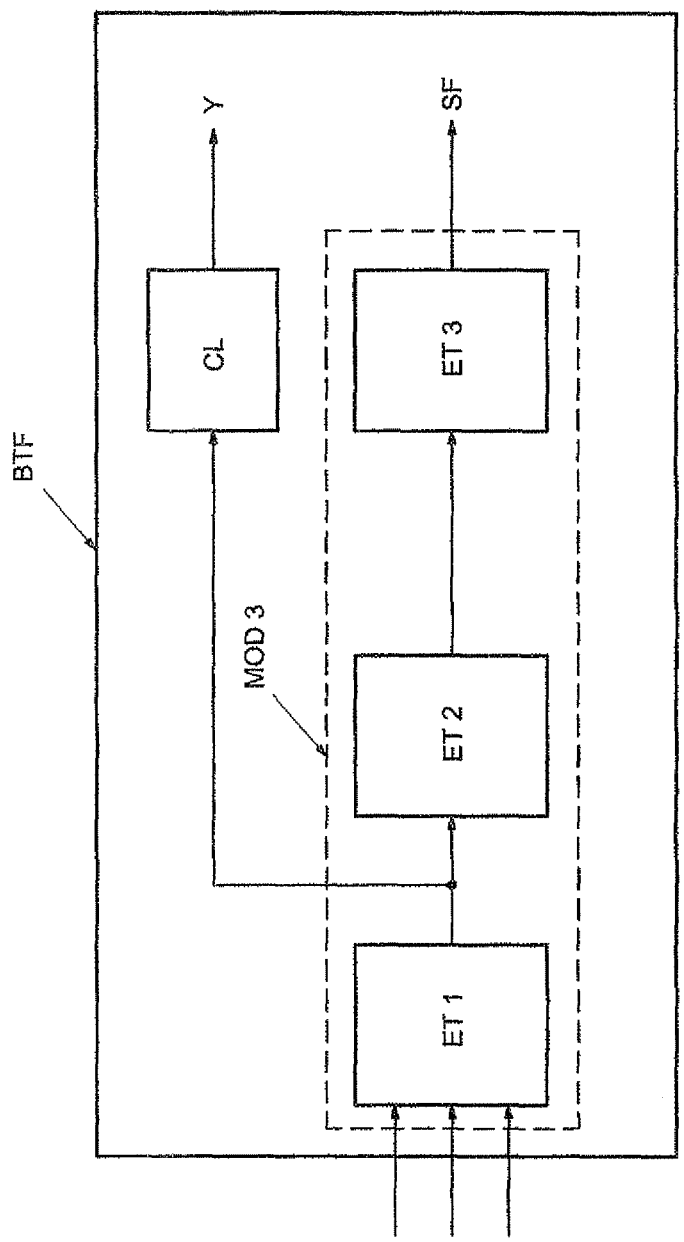

The logic cell CL will then be designed on the basis of logic gates for implementing such an anticipation logic function (V). Of course, it is possible to connect the input of the quantizer (input of the cell CL) at some other point situated upstream of the stage ET3 of the module MOD3, for example between the stages ET1 and ET2 of this module MOD3, as represented in FIG. 12. In this case, the anticipation logic function would be a logic function with seven inputs.

Having said this, it would also be possible to connect the input of the quantization cell CL at any intermediate node of the filter MFR and even directly to the signal input. However, of course, the further upstream one is with respect to the stage ET3, the more complex is the anticipation logic function and the bigger is the logic cell CL. A person skilled in the art will therefore be able to readily find a performance/compactness compromise depending on the application planned.

Of course, although a nonexact quantization delivering a signal quantized on one bit has been described, a quantization on n bits with n greater than 1 and less than N is possible, utilizing the formulation of n distinct anticipation logic functions and of n corresponding quantization logic cells in parallel.

The delta sigma modulator just described is not limited to a redundant coding of the BS type but to any type of redundant coding. Mention may be made in particular of a coding of the carry conservation type (better known as a carry-save). With such a coding, the number A is represented to the base 2 with the digits $a_i \in \{10, 1, 2\}$ on two wires such that $a_i = a_{i,c} + a_{i,s}$ where $a_{i,c} \in \{0, 1\}$ and $a_{i,s} \in \{0, 1\}$.

$$A = \sum_{i=0}^{n-1} a_i 2^i = \sum_{i=0}^{n-1} (a_{i,c} + a_{i,s}) 2^i$$

Figure 13:
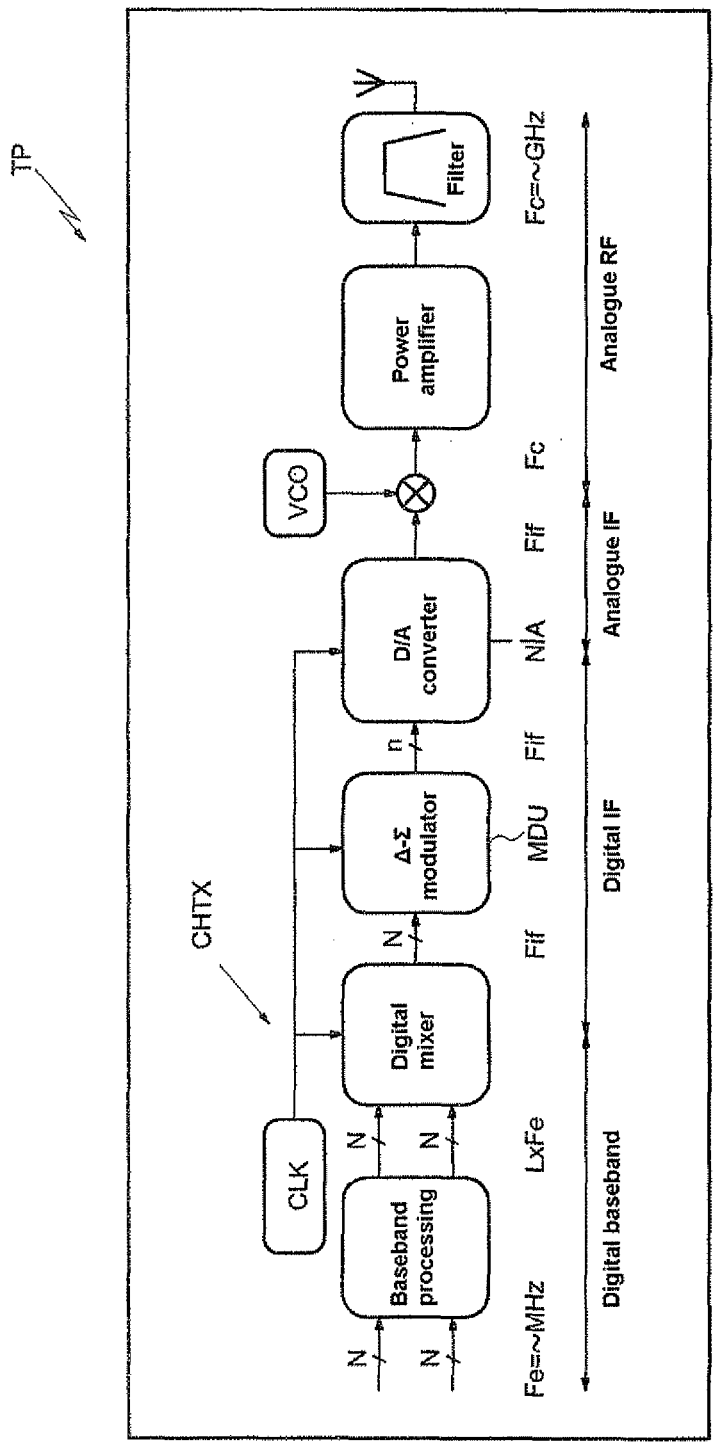
FIGS. 13 and 14 illustrate two examples of applications of a delta-sigma modulator according to the invention.
Figure 14:
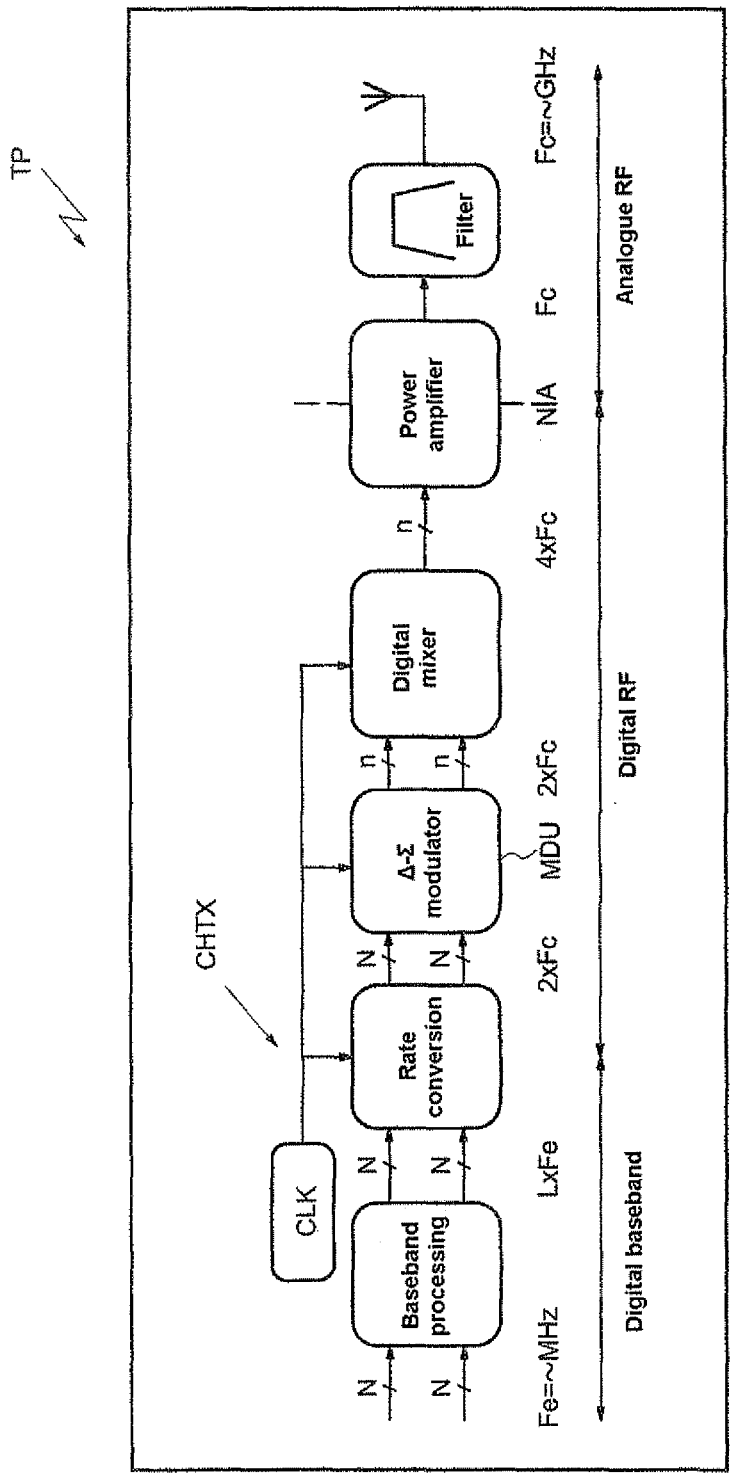

A modulator MDU may be inserted into the transmit chain CHTX of an element of a wireless communication system, for example a cellular mobile telephone TP, as illustrated in FIG. 13 and in FIG. 14. In FIG. 13, the delta-sigma modulator is used to generate the intermediate-frequency signal (carrier at the intermediate frequency Fif) while the transposition to the radio frequency Fc is ensured by an analog mixer supplied by a voltage-controlled oscillator VCO.

In FIG. 14, the modulator MDU generates the signal at the frequency Fc (radiofrequency) directly. By way of indication, in the case of a transmit chain intended to operate according to the UMTS-FDD standard with a frequency band of the signal lying between 1.92 and 1.98 GHz, the delta-sigma modulator will be regulated at a rate of the order of 4 giga samples per second. This represents a processing of the critical path of the filter in less than 250 picoseconds.

By then using a nonexact quantization on 3 bits anticipated in the manner just described, it may be shown that the quantization error made in the signal is small compared with the gain in the propagation time. Of course, depending on the application planned, the various parameters (e.g., the number of bits for the nonexact quantization, the value of the gains, the frequency of the clock signal, the order of the modulator, etc.) will be chosen as a function of the desired performance in view of a desired compromise between dynamic performance and supported rate, for example.

That which is claimed:

1. A method of processing a digital input signal sampled on N bits within a digital delta-sigma modulator the method comprising:
   providing a filtered sampled signal according to a redundant arithmetic coding; and
   providing an output signal that is anticipated, the output signal being sampled on n bits using a nonexact quantization, with n being less than N;
   with the filtered sampled signal comprising a succession of processing based on the digital input signal, samples of the filtered sampled signal and of the output signal, and with the anticipation of the output signal providing certain bits only of samples of intermediate sampled signals tapped off before a last processing for providing the filtered sampled signal.

2. The method according to claim 1, wherein the anticipation of the output signal further comprises providing the output signal in parallel with at least one of the processing for formulating the filtered sampled signal.

3. The method according to claim 2, wherein the output signal is provided in parallel with a last processing for providing the filtered sampled signal.

4. The method according to claim 1, wherein n nonexact quantization logic functions are defined, each involving a specific part only of the bits of each sample of the filtered sampled signal and each providing a bit of each sample of the output signal; and wherein providing the output signal comprises providing n anticipation logic functions, each anticipation logic function providing a bit of each sample of the output signal, and is obtained based on a corresponding nonexact quantization logic function involving particular bits of the samples of the intermediate signals for obtaining the specific bits for providing the filtered sampled signal.

5. The method according to claim 1, wherein the redundant arithmetic coding comprises a borrow-save (BS) coding.

6. A method of processing a digital input signal comprising:
   receiving digital samples of N bits an input signal;
   performing addition/subtraction and integration operations according to a redundant arithmetic coding for providing digital filtered sampled signal based on the received input signal; and
   providing the digital filtered sampled signal to a quantizer for performing a nonexact quantization operation for providing digital output samples of n bits, with n being less than N;
   with the filtered sampled signal comprising a succession of processing based on the digital input signal, samples of the filtered sampled signal and of digital output samples and with anticipation of the output samples providing certain bits only of samples of intermediate sampled signals tapped off before a last processing for providing the filtered sampled signal.

7. The method according to claim 6, wherein the anticipation of the output signal further comprises providing the output signal in parallel with at least one of the processing for formulating the filtered sampled signal.

8. The method according to claim 7, wherein the output signal is provided in parallel with a last processing for providing the filtered sampled signal.

9. The method according to claim 6, wherein n nonexact quantization logic functions are defined, each involving a specific part only of the bits of each sample of the filtered sampled signal and each providing a bit of each sample of the output signal; and wherein providing the output signal comprises providing n anticipation logic functions, each anticipation logic function providing a bit of each sample of the output signal, and is obtained based on a corresponding nonexact quantization logic function involving particular bits of the samples of the intermediate signals for obtaining the specific bits for providing the filtered sampled signal.

10. The method according to claim 6, wherein the redundant arithmetic coding comprises a borrow-save (BS) coding.

11. A digital delta-sigma modulator comprising:
a signal input for receiving digital samples of N bits of an input signal;
a digital filter coupled to the signal input for performing addition/subtraction and integration operations according to a redundant arithmetic coding for providing digital filtered samples; and
a quantizer comprising an input coupled to said digital filter and performing a nonexact quantization operation for providing digital output samples of n bits, with n being less than N;
said quantizer having n nonexact quantization logic functions, each involving a specific part only of the bits of each sample of the digital filtered samples and each providing a bit of each sample;
said quantizer comprising n logic cells respectively implementing n anticipation logic functions and respectively delivering the n bits of each sample of the output signal, each anticipation logic function being obtained based on the corresponding nonexact quantization logic function and the corresponding logic cells receiving as input particular bits of samples of intermediate signals to obtain the specific bits for at least one addition/subtraction stage downstream of the input of the cell.

12. The digital delta-sigma modulator according to claim 11, wherein said digital filter comprises a chain of at least one adder/subtracter module, each adder/subtracter module being looped back on itself and each comprising a plurality of addition/subtraction stages connected in cascade, the input of said quantizer being connected upstream of a last addition/subtraction stage of a last adder/subtracter module, and an output of said quantizer being looped back to each module.

13. The digital delta-sigma modulator according to claim 12, wherein the input of said quantizer is coupled internal to the last adder/subtracter module upstream of the last addition/subtraction stage of the last adder/subtracter module.

14. The digital delta-sigma modulator according to claim 11, wherein the redundant arithmetic coding comprises a borrow-save (BS) coding.

15. A wireless communication device comprising:
a signal input for receiving digital samples of N bits of an input signal;
a transmission chain coupled to the signal input and comprising
a digital filter for performing addition/subtraction and integration operations according to a redundant arithmetic coding for providing digital filtered samples and
a quantizer comprising an input coupled to said digital filter and performing a nonexact quantization operation for providing digital output samples of n bits, with n being less than N;
said quantizer having n nonexact quantization logic functions, each involving a specific part only of the bits of each sample of the digital filtered samples and each providing a bit of each sample;
said quantizer comprising n logic cells respectively implementing n anticipation logic functions and respectively delivering the n bits of each sample of the output signal, each anticipation logic function being obtained based on the corresponding nonexact quantization logic function and the corresponding logic cells receiving as input particular bits of samples of intermediate signals to obtain the specific bits for at least one addition/subtraction stage downstream of the input of the cell.

16. The wireless communication device according to claim 15, wherein said digital filter comprises a plurality of adder/subtracter modules, each adder/subtracter module being looped back on itself and each comprising a plurality of addition/subtraction stages connected in cascade, the input of said quantizer being connected upstream of a last addition/subtraction stage of a last adder/subtracter module, and an output of said quantizer being looped back to each module.

17. The wireless communication device according to claim 16, wherein the input of said quantizer is coupled internal to the last adder/subtracter module upstream of the last addition/subtraction stage of the last adder/subtracter module.

18. The wireless communication device according to claim 15, wherein the redundant arithmetic coding comprises a borrow-save (BS) coding.

* * * * *